United States Patent
Doeling

Patent Number: 6,136,512
Date of Patent: Oct. 24, 2000

[54] METHOD OF FORMING RESISTORS

[75] Inventor: Wallace Dean Doeling, Forest Grove, Oreg.

[73] Assignee: International Business Machines Corporation, Armonk, N.Y.

[21] Appl. No.: 09/325,668

[22] Filed: May 26, 1999

Related U.S. Application Data

[62] Division of application No. 08/960,275, Oct. 29, 1997, Pat. No. 5,945,257.

[51] Int. Cl.[7] ........................................ G03F 7/00
[52] U.S. Cl. .................. 430/313; 430/312; 430/314; 430/316; 430/318
[58] Field of Search ................... 430/312, 313, 430/314, 316, 318

[56] References Cited

U.S. PATENT DOCUMENTS

| | | | |
|---|---|---|---|
| 3,808,576 | 4/1974 | Castonguay et al. | 338/309 |
| 3,864,180 | 2/1975 | Barraclough | 156/3 |
| 3,904,461 | 9/1975 | Estep et al. | 156/11 |
| 4,801,469 | 1/1989 | Norwood | 427/103 |
| 4,808,967 | 2/1989 | Rice et al. | 338/309 |
| 4,820,547 | 4/1989 | Lindsay et al. | 427/97 |
| 4,888,574 | 12/1989 | Rice et al. | 338/309 |
| 4,892,776 | 1/1990 | Rice | 428/209 |
| 5,084,420 | 1/1992 | Tsai | 437/228 |
| 5,184,108 | 2/1993 | Bloom et al. | 338/195 |
| 5,347,258 | 9/1994 | Howard et al. | 338/333 |

*Primary Examiner*—Kathleen Duda
*Assistant Examiner*—Nicole Barreca
*Attorney, Agent, or Firm*—Klarquist Sparkman Campbell Leigh & Whinston LLP

[57] ABSTRACT

A method is disclosed for forming resistors that are low cost, easy to manufacture and substantially within 5 percent of their desired value. In one aspect of the method, an electrically resistive material, such as nickel, is deposited directly on an insulating layer, such as a substrate. In preferred embodiments a conductive material, such as copper, is then deposited on the resistive material only at a location where a signal trace is desired. Using photo-imaging, signal traces are formed in the conductive and resistive materials. A resistor is created by forming a gap in the conductive material at a location where the resistor is desired. Current is thereby forced to flow through the resistive material at the location of the gap.

15 Claims, 3 Drawing Sheets

METHOD OF FORMING RESISTORS

RELATED APPLICATION DATA

This application is a division of U.S. patent application Ser. No. 08/960,275, filed Oct. 29, 1997, now U.S. Pat. No. 5,945,257 issued Aug. 31, 1999.

FIELD OF THE INVENTION

The present invention relates generally to resistors, and more particularly to resistors formed on a printed circuit board.

BACKGROUND OF THE INVENTION

A typical printed circuit board (PCB) is formed from multiple layers of conductive and non-conductive materials. The conductive layers (i.e., signal layers) are made of copper or a copper alloy, while the non-conductive layers (i.e., insulating layers) are made from organic polymeric materials, reinforced epoxies, and the like. Signal traces are formed on the signal layers to couple together electronic and electrical devices (e.g., integrated circuits, capacitors, resistors, etc.) mounted to the outer surface of the PCB. The insulating layers are positioned between signal layers to electrically isolate the signal traces on each signal layer. Plated vias or through holes are drilled through the PCB to facilitate electrical connections between the signal layers.

Many of the surface-mounted electronic devices and other components on a PCB commonly require coupling to individual resistors for termination, impedance matching, etc. The resistors are often mounted to mounting pads on the outer surface of the PCB. However, the mounting pads introduce capacitive and inductive impedance, which slows the speed of the circuit. Additionally, the resistors use valuable surface area that could otherwise be used for integrated circuits.

Accordingly, some PCB manufacturers use buried resistors, which are resistors located on inner signal or plane layers of the PCB. To create buried resistors, a signal layer is formed by electroplating a layer of nickel onto a layer of copper. This resulting bi-layered structure is glued to an insulating layer with the nickel layer adjacent to the insulating layer. Signal traces are etched so that each trace includes both copper and nickel layers. The exposed background nickel is removed by etching. Resistors are formed by further etching gaps in the copper layer of the trace to expose the nickel below. Current flow along a signal trace normally flows through the less resistive copper layer, but at locations where the copper is etched away, current is forced to flow through the nickel. Since nickel is highly resistive relative to the copper, each gap in the copper layer forms a resistor having a value that is dependent on the width of the signal trace, the length of the gap in the copper, and the thickness of the nickel layer.

A prefabricated, bi-layered copper/nickel material is commercially available in large rolls from Ohmega Technologies, Inc. When manufacturing PCBs, the so-called Ohmega material or similar material must be unrolled and cut into sections the size of an insulating layer. The Ohmega material is then adhered to the insulating layer using glue or other adhesive.

Manufacturing PCBs using the Ohmega material or similar materials is costly and inefficient. The Ohmega material is difficult to work with because the large rolls of copper/nickel material are awkward to handle during manufacturing. Additionally, although the copper appears smooth to the naked eye, in actuality it is roughened to facilitate adhesion to the PCB when gluing. Such roughening causes peaks and valleys on the surface of the copper, and when the nickel is electroplated onto the copper, the nickel tends to be uneven, with a thicker deposition layer of nickel along the peaks and a thinner layer along the valleys. Because of the differing thicknesses of the nickel, the resistors formed from the nickel vary by as much as 20 percent. Such inconsistent resistor values are unacceptable and, consequently, many PCBs are scrapped as unusable. Additionally, gluing the Ohmega material to insulating layers is costly and reduces yield because of gluing imperfections. Still further, the use of Ohmega material limits the types of insulating materials that can be used as insulating layers because of incompatibility with the adhesives.

An objective of the invention, therefore, is to provide a method of forming a resistor on a PCB that has resistor values consistently within 5 percent of their desired value. A further objective is to provide a method of forming a resistor that has high yield and reduced cost.

SUMMARY OF THE INVENTION

The present invention provides a method of forming resistors that have extremely predictable resistor values substantially within 5 percent of their desired value. Additionally, using the method according to the invention, the need for adhesives is greatly reduced or eliminated. As a result, PCBs according to the invention can be made less expensively and with a higher production yield.

In one aspect of the method, an electrically resistive material is deposited directly onto an insulating layer. A conductive material is then deposited on the resistive material. A resistor may then be formed by removing the conductive material from the resistive material at a location where the resistor is desired. The resistive material and/or the conductive material may be deposited using electrodeposition, electroless deposition or immersion deposition.

Thus, rather than depositing a resistive material onto a conductive material and gluing the resultant bi-layered structure to the insulating layer, the method according to the invention deposits the resistive material directly onto the insulating layer, which allows a more uniform deposition of such material with a consistent and accurate thickness. Consequently, resistors formed from the resistive layer are substantially within 5 percent of their desired value.

A variety of materials may be used for the resistive layer, including nickel, chromium, cobalt, titanium, palladium, tin, zinc, rhodium, manganese, copper, iron, aluminum, molybdenum, and combinations thereof. The conductive layer can also be made from a variety of materials including copper, copper alloy, nickel, palladium, tin, gold, silver, and combinations thereof.

Forming resistors according to the method of the invention reduces or eliminates the need for adhesives, which can increase manufacturing costs and reduce yield. The reduction in use of adhesives also allows a wider range of insulating materials to be used. Additionally, plating of the resistive and conductive materials directly on the insulating layers is cheaper and easier to manufacture than using Ohmega or other rolled material.

These advantages and other advantages and features of the invention will become apparent from the following description of a preferred embodiment, which proceeds with reference to the following drawings.

DETAILED DESCRIPTION OF THE PREFERRED EMBODIMENTS

Figure 1:
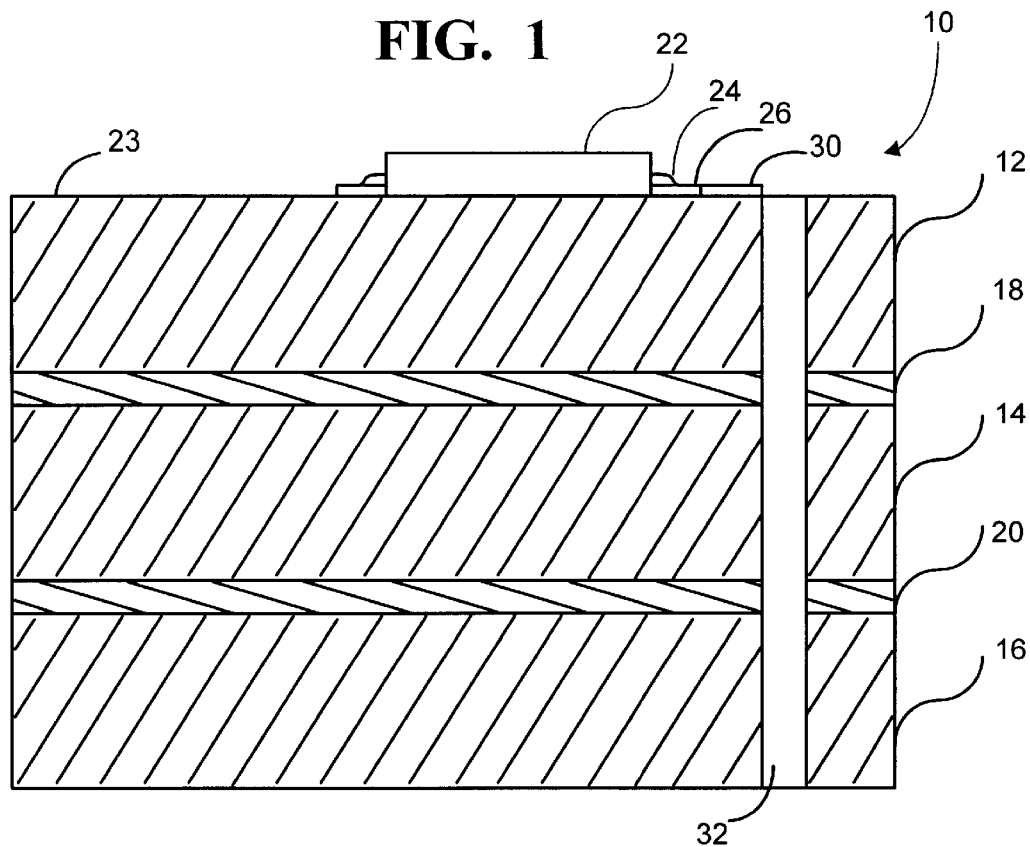
FIG. 1 is a cross-sectional view of a printed circuit board, according to the invention, having alternating insulating and signal layers.

FIG. 1 shows a cross-sectional view of a PCB 10. The PCB includes three insulating or non-conductive layers 12, 14, and 16 and three signal layers 18, 20 and 23. Signal layer 18 is positioned between insulating layers 12, 14 and signal layer 20 is positioned between insulating layers 14, 16. Insulating layers 12, 14 and 16 isolate signal layers 18, 20 to prevent current flow therebetween. Electronic components, such as an integrated circuit or chip 22, are mounted to an outer surface 23 (which is also a signal layer) of the PCB 10. The integrated circuit 22 includes legs 24 soldered to mounting pads 26 located on outside surface 23 of the PCB. Signal traces or paths, such as signal trace 30, are formed on surface 23 of PCB 10 or on inner signal layers 18, 20 to carry signals between electronic components mounted on the PCB. Plated vias or through holes 32 extend through PCB 10 to interconnect signal traces on surface 23 of the PCB to signal traces (not shown) on inner signal layers 18, 20. Although PCB 10 is shown with only a single via 32 and a single integrated circuit 22, PCBs usually contain a large number of vias and integrated circuits. Additionally, although three insulating layers 12, 14, 16 and three signal layers 18, 20 and 23 are shown, any number of layers may be used.

Figure 2:
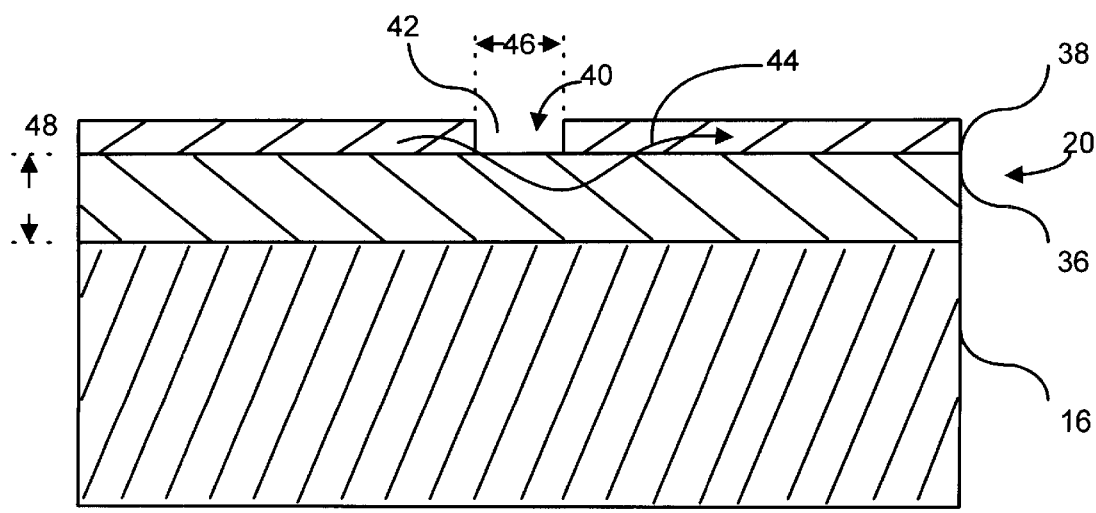
FIG. 2 is a cross-sectional view showing a resistor formed in a signal layer of FIG. 1.

FIG. 2 is a cross-sectional view of signal layer 20 and insulating layer 16 of FIG. 1. The signal layer 20 includes a layer of electrically resistive material 36 adjacent to insulating layer 16 and a layer of electrically conductive material 38 adjacent to resistive material 36. Conductive material 38 is typically formed from copper, a copper alloy, nickel, palladium, tin, gold, silver, and/or combinations thereof. Resistive material 36 is typically nickel, which has a resistivity of approximately ten times that of copper. Other resistive materials may be used, such as chromium, manganese, copper, iron, aluminum, molybdenum, cobalt, titanium, palladium, tin, zinc, rhodium, and different combinations of these metals.

Insulating layer 16 can be a number of materials well known in the art. For example, insulating layer 16 can be made from ceramic, silicon, polyamide, polyester, liquid crystal, organic polymeric materials, reinforced epoxies, polytetrafluoroethylene (e.g., Teflon) or any combinations of these elements.

Typically, when signal traces include both conductive material 38 and resistive material 36, a majority of current passes through the conductive material, while only a small portion passes through the more resistive material. However, when a resistor is formed in signal layer 20, a majority of current flows through resistive material 36. For example, a resistor 40 is formed in signal layer 20 by etching the conductive material at a given point to form a gap 42 exposing the resistive material beneath the conductive material. All that remains, therefore, is a trace effectively formed from conductive material, but having a short resistive segment that forms resistor 40. The current passing through conductive material 38 is forced to flow through resistive material 36, as indicated by an arrow 44. The resistor value of resistor 40 depends on a width 46 of gap 42, a thickness 48 of resistive material 36, a width of the resistor trace, and the composition of the material. Notably, the resistor does not need to be the same thickness as the signal trace (e.g., the resistor can be narrower or wider than the signal trace).

Figure 3:
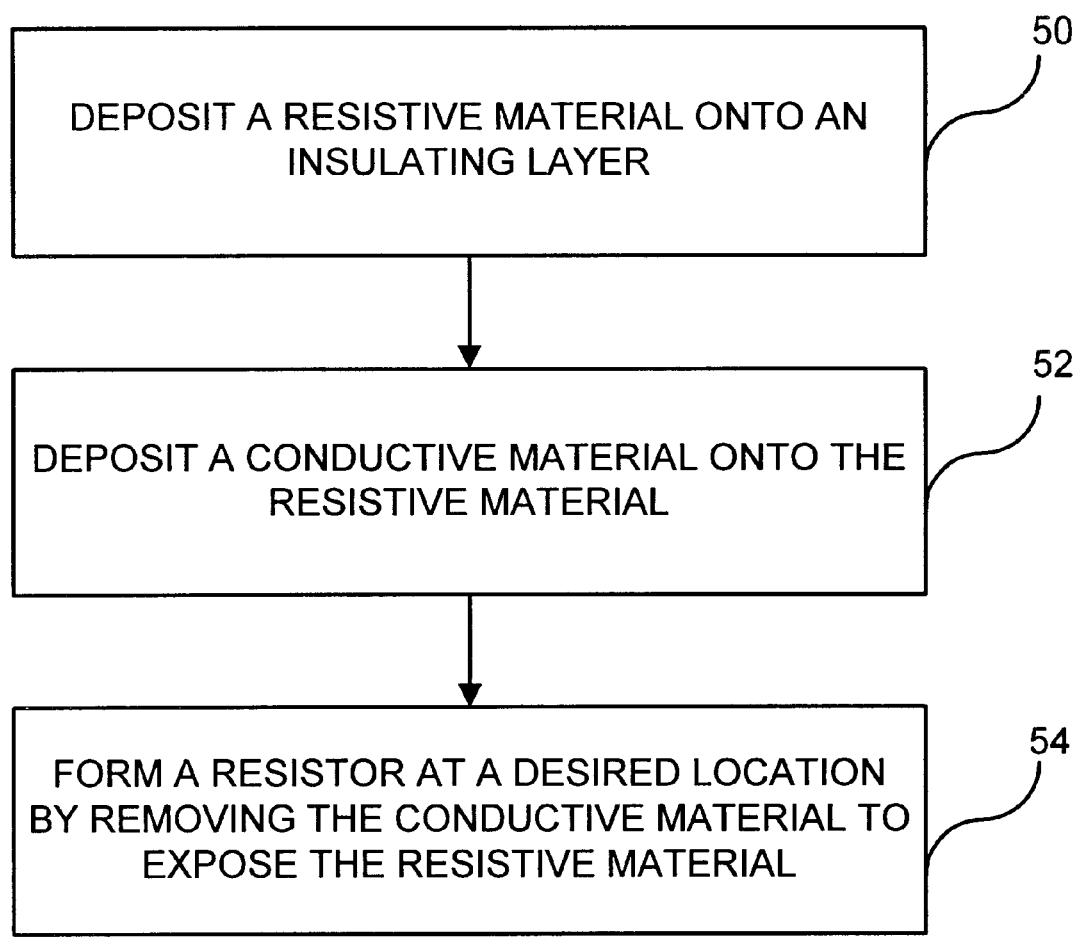
FIG. 3 is a flow chart of a method for forming the resistor of FIG. 2.

FIG. 3 is a flow chart of steps taken to form the resistor 40 of FIG. 2. Rather than first attaching the conductive material to the resistive material and then adhering this bi-layer structure to the insulating layer, the method according to the present invention deposits resistive material 36 directly onto insulating layer 16 without the need for an adhesive, such as glue (step 50).

Resistive material 36 is typically deposited onto the insulating layer by electroless plating, electroplating, or immersion plating. Electroless plating is the deposition of a metal in solution onto another material by chemical means, rather than by gluing or by means of an electric current as in electrodeposition. One example of electroless plating is where the object to be plated is immersed in a solution. Generally, electroless solutions contain one or more metal salts, a reducing agent, a pH adjustor or buffer, a complexing agent, and one or more additives to control stability, film properties, deposition rates, etc. An advantage of electroless solutions is their ability to coat metallic films on prepared insulators and their ability to uniformly coat a platable object. Electroless plating is autocatalytic so that a material being deposited can build-up on a surface for a desired thickness.

Electroplating means to coat with a metal by passing an electric current through an electrolyte with subsequent migration of ions to the electrodes.

Immersion plating causes a displacement reaction wherein one atom of the coating material reacts with one atom of the surface material. The displacement stops when the surface material is completely covered by a thin layer of material being deposited.

Other techniques for the deposition of metal include vacuum deposition, electron beam deposition, plasma deposition, electric arc deposition, electrostatic deposition, chemical vapor deposition, diffusion, spraying, etc.

After the resistive material is deposited onto the insulating layer, the conductive material, such as copper, is deposited onto the resistive material (step 52). This step may also be accomplished by any of the techniques described above.

Step 54 shows that a resistor is formed by removing the conductive material 38, thereby exposing the resistive material 36. The result is that a gap, such as gap 42 (FIG. 2), is formed in conductive material 38.

Figure 4:
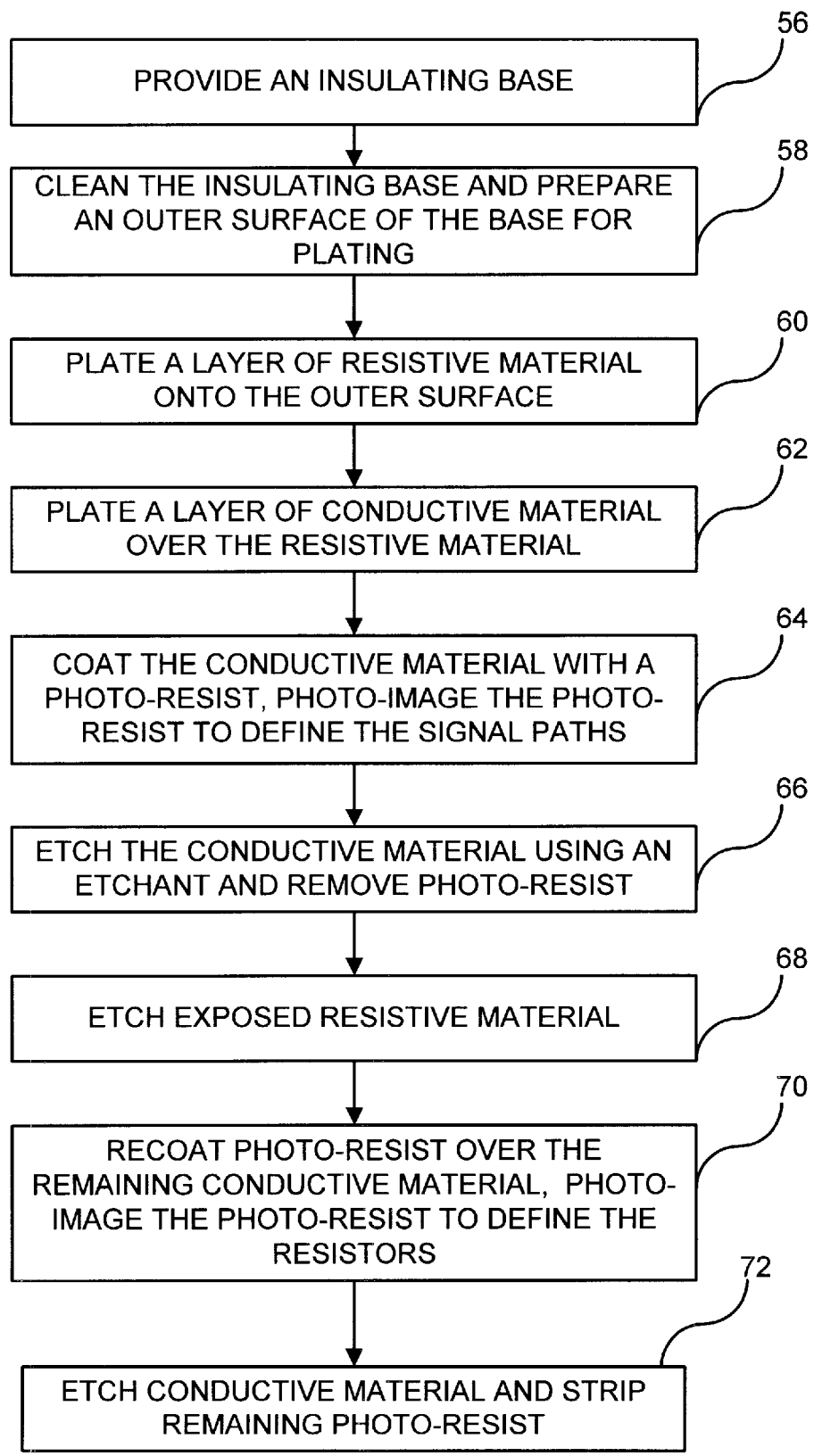
FIG. 4 is a more detailed flow chart of the method of FIG. 3.

FIG. 4 shows a more detailed flow chart of the method of the present invention. Step 56 shows that an insulating base, such as an insulating layer, is provided. In step 58, the insulating base is cleaned and prepared for plating. The choice of proper cleaning depends primarily on the nature of the insulating base to be prepared and the nature and amount of the soils to be removed. A typical cleaning cycle includes the following steps: pickling; any mechanical preparation, such as polishing or buffing; cleaning to remove oils, greases, shop dirt, and polishing and buffing compounds; acid-dipping to remove oxide films; and rinsing. The method of cleaning the insulating base is not of importance to the invention. Other cleaning techniques may be used. The surface of the insulating base is catalyzed (and may be slightly roughened) to facilitate the chemical bonding of the resistive material to the insulating base.

In step 60, the layer of resistive material is plated onto the outer surface of the insulating base. Such plating can be accomplished through electrodeposition, immersion, or electroless deposition, or any other technique described above. These plating techniques create a chemical bond between the resistive material and the insulating base. Chemical bonding means the joining together of atoms, such as by ionic bonding, covalent bonding, valence bonding, or any other bonding now known or later discovered. Chemical bonding allows the resistive material to be attached to the insulating base without requiring a separate adhesive, such as glue. Some amount of glue can be used, however, to supplement the chemical bonding, if desired. Using these techniques, an accurate thickness of the resistive layer can be achieved.

Step 62 shows that the conductive material is plated over the resistive material. Again, a variety of techniques can be used to achieve such plating, but immersion deposition, electroless deposition and electrodeposition are preferred.

In step 64, the conductive layer is coated with a photo-resist. This may be a positive or a negative resist. A positive resist is a resist that washes away after being exposed to ultraviolet light. A negative resist is a resist that remains on the surface wherever it is exposed. In either case, the photo-resist is photo-imaged using a mask to define the signal traces to be created.

In step 66, the conductive material is then etched using a suitable etchant, such as a cupric chloride, ferric chloride, or ammoniacal copper etchants. The photo-resist is then removed. At this point the signal traces are defined in the conductive material, but the resistive material remains fully intact.

In step 68, the exposed resistive material is etched using a desired etchant to define the signal traces. Suitable etchants include copper sulphate, chrome sulfuric, or a potassium iodide/iodine solution. At this point, the signal traces are defined and formed from a layer of resistive material with a layer of conductive material on top of the resistive material.

Step 70 shows that the remaining conductive material is re-coated with a positive or negative photo-resist and photo-imaged to define the resistors. A mask is used to define where gaps, such as gap 42 (FIG. 2), are to exist in the signal trace.

Step 72 shows that the conductive material is etched using an etchant, and the remaining photo-resist is stripped away. The resistors are thereby formed and electrically tested to ensure they are within a desired tolerance.

Many different types of etchant for the resistive layer may be used. Some possible etchants include potassium iodide and iodine dissolved in water. One particular nickel etchant includes one liter of $H_2O$, 125 grams of potassium iodide (which should be dissolved in the $H_2O$ first), and 42 grams of iodine. The resulting nickel etchant should be used at 60 F. Of course, many different types of etchants known in the art may be used and the invention is not limited to any particular etchant.

There are many different techniques to create the resistors after the resistive layer is deposited on the insulating base. The particular technique used is not of importance. The above-described technique is commonly referred to by those skilled in the art as panel platting. Another technique that may be used is pattern platting. Using pattern platting the following steps are carried out: After the resistive layer is deposited, a layer of photo-resist is placed over the resistive layer; The photo-resist is photo-imaged to define the signal paths or traces in the resistive layer; Next, the conductive layer is plated onto the photo-resist defined pattern to a desired thickness (e.g., this defines copper traces on nickel); The resist is then removed so that conductive traces defined by the mask remain; The exposed resistive material can then be removed using a suitable etchant; A resist coating is again applied over the entire area and is photo-imaged to indicate where the resistors are desired; The conductive layer is again etched and the remaining resist removed; The resulting resistors are thereby formed and tested for an accurate value.

Having illustrated and described the principles of the invention in a preferred embodiment, it should be apparent to those skilled in the art that the embodiment can be modified in arrangement and detail without departing from such principles.

For example, although the resistors are primarily described as buried resistors, such resistors may be formed on the surface as well.

Additionally, although the method is described in relation to resistors on printed circuit boards, the method may also be used to form discrete resistors or resistors in semiconductor packages, resistor arrays, and multichip module packages. The resistors may be formed on ceramic, silicon, anodized aluminum, anodized titanium, glass, ruby, diamond, etc.

In view of the many possible embodiments to which the principles or invention may be applied, it should be recognized that the illustrated embodiment is only a preferred example of the invention and should not be taken as a limitation on the scope of the invention. Rather, the invention is defined by the following claims. I therefore claim as the invention all such embodiments that come within the scope of these claims.

I claim:

1. A method of forming a resistor in a printed circuit board, comprising:

providing an organic insulating layer;

depositing an electrically resistive material directly on the insulating layer;

depositing an electrically conductive material on the electrically resistive material only at a location on the resistive material where a signal trace is desired; and removing the electrically conductive material from the electrically resistive material at a location where a resistor is desired in the signal trace.

2. The method of claim 1 wherein the depositing of electrically resistive material is accomplished by electrodeposition.

3. The method of claim 1 wherein the depositing of the electrically resistive material is accomplished by electroless deposition.

4. The method of claim 1 wherein the depositing of the electrically resistive material is accomplished by immersion deposition.

5. The method of claim 1 wherein at least one of the depositing steps is accomplished by a deposition technique selected from a group consisting of vacuum deposition, electron beam deposition, plasma deposition, electric arc deposition, electrostatic deposition, chemical vapor deposition, diffusion, spraying, and combinations thereof.

6. The method of claim 1 wherein the electrically resistive material is selected from a group consisting of nickel, chromium, cobalt, titanium, palladium, tin, zinc, rhodium, manganese, copper, iron, aluminum, molybdenum, and combinations thereof.

7. The method of claim 1 wherein the electrically conductive material is selected from a group consisting of copper, copper alloy, nickel, palladium, tin, gold, silver, and combinations thereof.

8. The method of claim 1 wherein the insulating layer is selected from a group consisting of epoxy, liquid crystal, polymeric materials, reinforced epoxies, and combinations thereof.

9. The method of claim 1 wherein depositing an electrically conductive material on the electrically resistive material only at location in the resistive material where a signal trace is desired comprises:

depositing a layer of photo-resist on the layer of resistive material prior to depositing the electrically conductive material on the electrically resistive material;

photo-imaging a pattern of signal traces in the photo-resist; and depositing the layer of conductive material on the resistive material exposed by the photo-imaging.

10. The method of claim 1 wherein removing the electrically conductive material from the electrically resistive material where a resistor is desired in the signal trace comprises:

depositing a layer of photo-resist on the electrically conductive material;

photo-imaging a pattern of resistors in the photo-resist; and etching the layer of conductive material exposed by the photo-imaging.

11. The method of claim 10 wherein the photo-resist is a positive resist.

12. The method of claim 10 wherein the photo-resist is a negative resist.

13. The method of claim 1 further including sensitizing a surface of the insulating layer to create a catalytic surface for deposition of the resistive material.

14. The method of claim 1 wherein the resistive material is chemically bonded to the insulating layer.

15. A method of forming a resistor in a printed circuit board, comprising the steps of:

providing an organic base material;

cleaning, roughening, and catalyzing the base material;

depositing a layer of resistive material directly over the base material;

depositing a layer of photo-resist over the layer of resistive material;

photo-imaging a pattern of signal traces in the photo-resist;

depositing a layer of conductive material onto the photo-resist defined pattern of signal traces;

removing the photo-resist, thereby leaving a pattern of signal traces formed from a layer of resistive material and a layer of conductive material;

etching the resistive material layer to remove exposed resistive material;

depositing a layer of photo-resist over the signal traces;

photo-imaging a pattern of resistors on the signal traces; and etching the conductive material that coincides with the pattern of resistors.

\* \* \* \* \*